US008590839B2

(12) United States Patent
Giannelli et al.

(10) Patent No.: US 8,590,839 B2
(45) Date of Patent: Nov. 26, 2013

(54) AIRCRAFT COCKPIT WITH INFORMATION DISPLAY DEVICE

(75) Inventors: Brice Giannelli, L'Isle Jourdain (FR); Jacques Rosay, Toulouse (FR)

(73) Assignees: Airbus, Blagnac (FR); Airbus Operations SAS, Toulouse (FR)

( * ) Notice: Subject to any disclaimer, the term of this patent is extended or adjusted under 35 U.S.C. 154(b) by 210 days.

(21) Appl. No.: 13/130,195

(22) PCT Filed: Dec. 15, 2009

(86) PCT No.: PCT/FR2009/001425
§ 371 (c)(1),
(2), (4) Date: May 19, 2011

(87) PCT Pub. No.: WO2010/084252
PCT Pub. Date: Jul. 29, 2010

(65) Prior Publication Data
US 2011/0226902 A1    Sep. 22, 2011

(30) Foreign Application Priority Data
Dec. 16, 2008  (FR) ...................................... 08 58647

(51) Int. Cl.
*B64C 1/00* (2006.01)
(52) U.S. Cl.
USPC ..................................................... 244/129.1
(58) Field of Classification Search
USPC .......................................... 244/129.1, 118.5
See application file for complete search history.

(56) References Cited

U.S. PATENT DOCUMENTS

| 4,529,150 | A | 7/1985 | Owen et al. |
| 6,616,165 | B2 * | 9/2003 | Tsuji ........................... 280/288.4 |
| 6,791,902 | B1 * | 9/2004 | Steiner et al. ................... 367/99 |
| 2003/0062906 | A1 | 4/2003 | Anderson et al. |
| 2008/0154446 | A1 * | 6/2008 | Rui et al. .......................... 701/3 |

FOREIGN PATENT DOCUMENTS

| CN | 201004655 | * | 1/2008 |
| EP | 1 298 973 | | 4/2003 |
| FR | 2 663 605 | | 12/1991 |

OTHER PUBLICATIONS

International Search Report issued Apr. 1, 2010 in PCT/FR09/01425 filed Dec. 15, 2009.

* cited by examiner

*Primary Examiner* — Timothy D Collins
*Assistant Examiner* — Jamie S Stehle
(74) *Attorney, Agent, or Firm* — Oblon, Spivak, McClelland, Maier & Neustadt, L.L.P.

(57) ABSTRACT

An aircraft cockpit that includes an information display device with a screen having a display surface and a rear surface opposite the display surface, and a cable harness connected to the screen. The rear surface includes a mechanism for retaining the cable harness substantially wound against the rear surface. The information display device is mobile within the cockpit.

14 Claims, 2 Drawing Sheets

AIRCRAFT COCKPIT WITH INFORMATION DISPLAY DEVICE

BACKGROUND

This invention relates to an aircraft cockpit equipped with an information display device as well as to an aircraft.

In general, this invention relates to the layout of an aircraft cockpit, and more precisely to the availability of necessary information during the various phases of use of the aircraft.

In an aircraft cockpit, several screens make it possible to display useful information.

In particular, two major types of displayed data are differentiated: on the one hand, avionic data necessary for the actual flying of the aircraft and on the other hand, data ancillary to the avionics, of the chart, documentation type, . . . , relating to the outside world without being directly connected with flying of the aircraft.

These data ancillary to the avionics are not necessary during all the flight phases of the aircraft, but are used only during certain specific phases, and for example in approach and landing phases of the aircraft, or even in ground phases during preparation for a flight or for maintenance operations on the aircraft.

This information generally is presented on an information display device comprising a screen having a display surface and a cable bundle connected to the screen.

Such a cable bundle makes it possible to supply the screen continuously without loss of information and is necessary at the time of fitting out an aircraft cockpit in order to ensure continuity of display of a large number of data.

Nonetheless, such a cable bundle is restricting with respect to the possibilities for positioning of the screen, and the latter generally occupies a fixed position in the cockpit, even though the information displayed is not referred to continuously by the pilots.

SUMMARY

This invention has the purpose of proposing a cockpit having an information display device improving the ergonomics in the presentation of useful information.

To this end, this invention relates, according to a first aspect, to a cockpit comprising an information display device including a screen having a display surface and a rear surface, opposite the said display surface, and a cable bundle connected to the screen.

According to the invention, the rear face comprises means for holding the cable bundle more or less wound against the rear surface, the information display device being movable between a position in which the cable bundle is held by the holding means more or less wound against the rear surface of the screen and a position in which the cable bundle is at least partially unwound.

In this way the cable bundle is protected and stored behind the screen, allowing this screen to occupy a position in which the cable bundle does not interfere with the environment.

The screen thus may occupy at least two positions according to the winding or non-winding of the cable bundle, in this way making it possible to change the location for presentation of the information available on this screen, according to the usefulness of this information.

The aircraft cockpit thus may be equipped with an information display device in which the cable bundle is protected and stored behind the screen, interfering neither with the pilot nor with a flight instrument in this position of the screen.

By virtue of the available cable-bundle length, this information display device may be moved about in the cockpit by a simple unwinding of the cable bundle accommodated behind the screen.

The holding means preferably are adapted for holding the cable bundle wound more or less at the periphery of the rear surface.

These holding means thus make it possible to hold a considerable cable-bundle length equal at least to the perimeter of the screen.

The winding direction of the cable bundle against the rear surface of the screen advantageously is reversible.

In this way identical screens may be used in different locations, only the winding direction of the cable bundle being changed to take into account different possibilities for positioning of the screen.

In practice, the information display device is movable between a main position in which the information display device is fastened to a side wall of the cockpit, the cable bundle being held by the holding means more or less wound against the rear surface of the screen, and a secondary position, in which the information display device is disposed at the instrument panel of the cockpit.

According to the use or nonuse by the pilot of the information displayed on the information display device, the latter may be placed ergonomically facing the pilot, or in its main position, fastened to a side wall of the cockpit, when the pilot uses primarily the flight controls and reads avionic data.

The winding of the cable bundle behind the rear surface of the screen makes it possible to achieve an information display device not interfering with the other elements of the cockpit when it is in its main position.

In practice, in the secondary position of the information display device, the screen is pivoted by 180° in relation to the position of the screen of the information display device in the main position, the cable bundle being at least partially unwound from the rear surface of the screen.

In this way, the changeover of the screen from one position to another is achieved by a simple pivoting thereof.

The cockpit of an aircraft advantageously comprises two identical information display devices, adapted respectively for occupying two main positions in which the information display devices are fastened respectively to the two opposite side walls of the cockpit, the winding direction of the cable bundle of one of the said information display devices being opposite to the winding direction of the cable bundle of the other information display device.

The cockpit of an aircraft thus may be equipped with identical information display devices irrespective of their lateral positions in the cockpit, by virtue of the reversibility of the winding direction of the cable bundle allowing pivoting of the screen to the left or to the right to come to occupy a secondary position at the instrument panel of the cockpit starting from its main position on a side wall of the cockpit.

According to a second aspect, this invention also relates to an aircraft comprising a cockpit such as described above.

This aircraft has characteristics and advantages similar to those described with reference to the cockpit.

Other features and advantages of the invention also will become apparent in the description below.

BRIEF DESCRIPTION OF THE DRAWINGS

On the attached drawings, provided by way of non-limitative examples.

DETAILED DESCRIPTION

First of all, an information display device according to one embodiment of the invention is going to be described with reference to FIG. 1.

The information display device is adapted for fitting out an aircraft and may be used for the display of information relating to the outside world, made up of data ancillary to the avionics.

These data comprise in particular different types of charts, documentation, files for maintenance of the airplane, accessibility of airports, . . .

The distinctive feature of this type of information derives from the fact that it does not have to be displayed continuously facing the pilot, so as not to disturb him during flying of the aircraft, but has to be available during certain flight phases.

Figure 1:
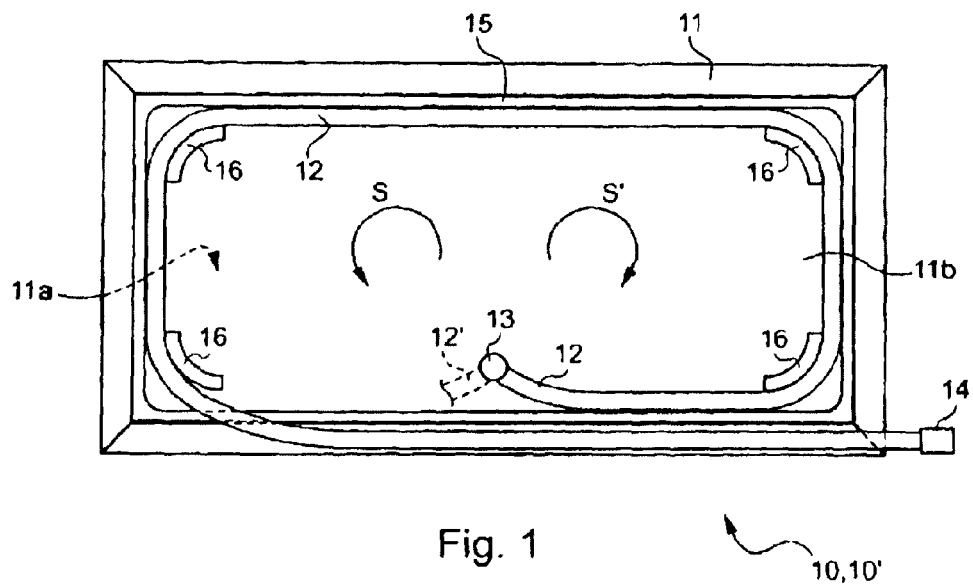
FIG. 1 is a rear view of a screen of an information display device according to one embodiment of the invention.

Information display device 10 illustrated on FIG. 1 comprises a screen 11 of which a display surface 11a (not visible on FIG. 1) makes it possible, in standard manner, to display information in the form of a table, chart, text . . .

A rear surface 11b opposite display surface 11a extends generally in a plane more or less parallel to display surface 11a. This screen 11 may be of the flat screen type, and preferably a touch screen.

Information display device 10 also comprises a cable bundle 12 connected to the screen at a connection terminal 13.

This cable bundle 12 creates a wired link making it possible to transmit a large number of data to screen 11 in real time and constitutes a preferential means for supplying a screen in real time without loss or discontinuity of display or interaction in a cockpit of an aircraft.

This cable bundle thus has a first connection terminal 13 connected to screen 11 and a second connection terminal 14 intended to be connected at a fixed connection point of the environment.

The length of this cable 12 makes it possible to position screen 11 at a distance more or less remote from the fixed connection point.

As clearly illustrated on FIG. 1, according to the invention, rear surface 11b of screen 11 comprises means for holding cable bundle 12 more or less wound against this rear surface 11b.

In this embodiment, and in a manner in no way limitative, rear surface 11b of screen 11 comprises a peripheral rim 15 here extending over the entire periphery of rear surface 11b of screen 11.

In cooperation with this peripheral rim 15, the holding means for cable bundle 12 here comprise fastening elements 16 disposed in the corners of rear surface 11b.

In this embodiment where rear surface 11b of the screen is more or less rectangular, four fastening elements 16 are disposed respectively at the four corners of rear surface 11b.

In this embodiment, each fastening element 16 is made up of a semi-circular rib defining in each corner, with peripheral rim 15, a semi-annular accommodation for holding a portion of cable bundle 12 in place.

These fastening elements 16 preferably form elastic holding means adapted for holding, by gripping, cable bundle 12 between each fastening element 16 and peripheral rim 15.

These elastic fastening elements 16 thus constitute clamps making it possible to hold cable bundle 12 detachably, by gripping.

As clearly illustrated on FIG. 1, the holding means made up of peripheral rim 15 and fastening elements 16 make it possible to hold cable bundle 12 wound at the periphery of rear surface 11b of screen 11.

In the example illustrated on FIG. 1, the winding direction of the cable bundle is schematized by arrow s and corresponds to the counter-clockwise direction.

The winding direction of cable bundle 12 is reversible, however, as schematized in a dotted line by the truncated cable portion 12' starting from first connection terminal 13.

The winding direction of cable bundle 12' schematized by arrows thus may correspond to the clockwise direction.

By way of non-limitative example, the screen may be a screen with an outside dimension on the order of 300 mm by 250 mm.

The length of cable 12 may be more or less equal to 1 m so that in wound position of cable bundle 12 against rear surface 11b of the screen, almost all of cable bundle 12 is retracted behind screen 11, only second connection terminal 14 extending beyond the screen.

Of course, other holding means for cable bundle 12 might be used.

In particular, rear surface 11b of the screen might comprise at its periphery a continuous channel in which the cable bundle may be forcibly accommodated.

Figure 2:
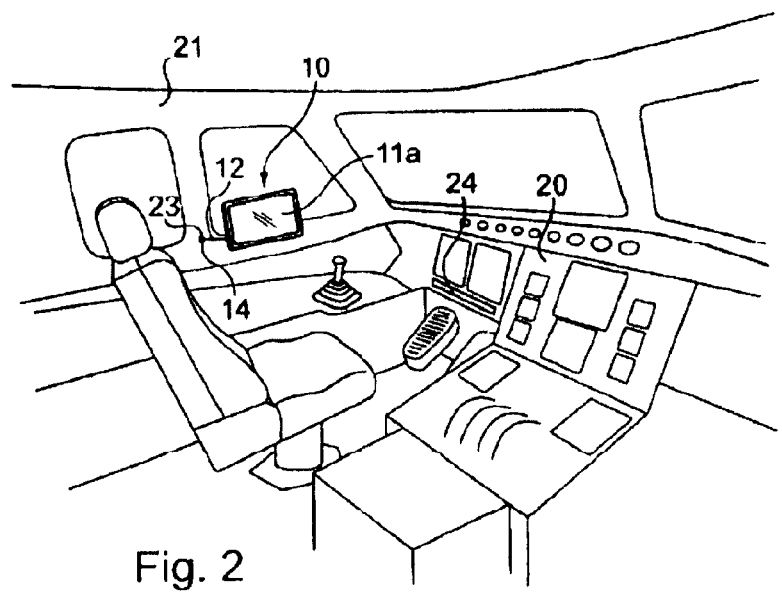
FIG. 2 is a schematic view illustrating an aircraft cockpit in accordance with the invention, an information display device occupying a first position.

As clearly illustrated on FIG. 2, a cockpit of an aircraft may be equipped with information display device 10 described above with reference to FIG. 1.

A cockpit usually comprises an instrument panel 20 disposed at the front of the cockpit and side walls (only one of walls 21 being illustrated on FIG. 2).

These side walls extend on both sides of instrument panel 20.

Information display device 10 is illustrated on FIG. 2 in a position referred to as main position in which information display device 10 is fastened to a side wall 21 of the cockpit, and here to the left side wall of the cockpit.

In this position, cable bundle 12 is held by the holding means more or less wound against the rear surface of the screen, only second connection terminal 14 extending beyond screen 11 to be fastened at a fixed connection point 23 provided for this purpose in side wall 21 of the cockpit.

In this main position, information display device 10 does not interfere directly with the field of vision of the pilot, so that the information presented on this screen and which is not of prime importance for flying the aircraft may be consulted by the pilot at his convenience nonetheless without hindering the presentation of information necessary for flying the aircraft and which is presented on other standard display devices of instrument panel 20 situated facing the pilot.

As clearly illustrated on FIG. 3, this information display device 10 is movable between the main position described with reference to FIG. 2 and a secondary position illustrated on FIG. 3, in which information display device 10 is disposed at instrument panel 20 of the cockpit.

In this secondary position of information display device 10, cable bundle 12 is at least partially unwound from rear surface 11b of screen 11 while remaining connected via its second connection terminal 14 to fixed connection point 23.

The length of cable bundle 12 is sufficient to allow the movement of screen 11 between the main position on side wall 21 and the secondary position at instrument panel 20.

In this secondary position, and in non-limitative manner, information display device 10 is installed on a retractable shelf 24 in the cockpit.

In this secondary position, screen 11 is placed facing the pilot to enable him to view ergonomically the information presented on this information display device 10 during certain flight phases of the aircraft.

Taking into account the winding of cable bundle 12 in the main position, screen 11 is pivoted by 180° between this main position and the secondary position, and vice versa.

Figure 3:
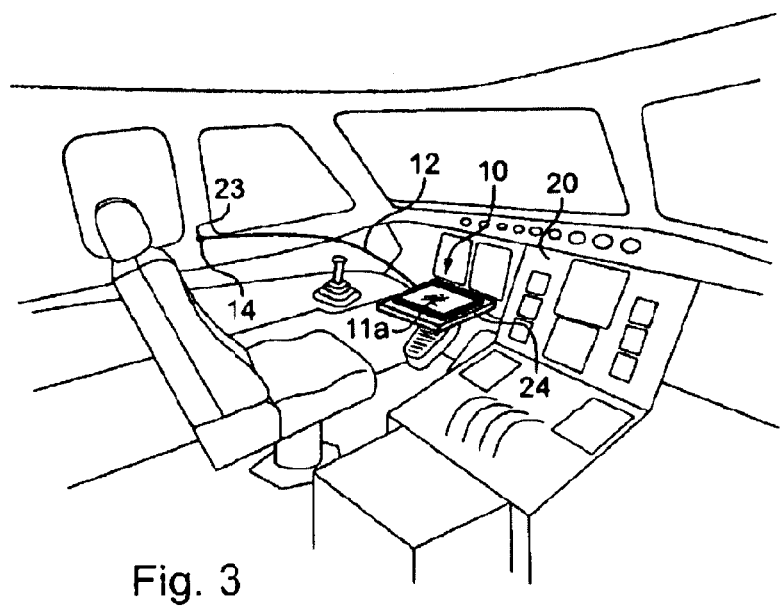
FIG. 3 is a schematic view of an aircraft cockpit similar to FIG. 1, the information display device occupying a second position.

In the embodiment described with reference to FIGS. 2 and 3, the cable bundle is wound behind screen 11 of information display device 10 in the counter-clockwise direction and the pivoting of screen 11 between the position illustrated on FIG. 2 and the position illustrated on FIG. 3 is accomplished by a pivoting of the screen in the clockwise direction.

This movement makes it possible to achieve unwinding of cable bundle 12 automatically when screen 11 is moved from its main position to its secondary position.

Information display device 10 preferably is equipped with means for reversing by 180° the image presented on display surface 11a of the screen in order to ensure the legibility of the information after having pivoted a screen 11 by a half-turn between its main position and its secondary position.

For this purpose, the information display device may comprise a manual actuation means for reversing the display by 180°, at the request of the pilot, or even a movement sensor adapted for automatically reversing the direction of the display according to the position of screen 11.

It will be noted that in a single movement it is possible to pivot the screen and unwind the cable bundle 12 between the main position and the secondary position, thus allowing the pilot an almost instantaneous access to the information presented on this screen when he has need thereof.

In this way, no movable mechanism or part is necessary since by simple detachment then pivoting of screen 11, cable bundle 12 unwinds and makes it possible to position the screen in the secondary use position.

Information display device 10 is fastened on side wall 21 of the cockpit by any appropriate mechanical means, with manual locking and unlocking, allowing an intuitive, reliable and rapid manipulation by the pilot.

It furthermore will be noted that, because of the reversible winding direction of cable bundle 12, either one or the other of the two opposite side walls of the cockpit may be equipped with such a screen, so long as the winding direction of the cable bundle is reversed.

Thus, in practice, the cockpit may comprise two identical information display devices 10, 10' intended to occupy two main positions on each opposite side wall of the cockpit, the winding direction of cable bundle 12, 12' of each device 10, 10' being opposite to one another.

In this way information display device 10 may be placed on the left side wall and information display device 10' may be placed on the right side wall.

Information display device 10 may be brought to the instrument panel on the left side of the cockpit and information display device 10' may be brought to the instrument panel on the right side of the cockpit, for example respectively facing two pilot seats of the aircraft.

Outfitting the cockpit with reversible screens makes it possible to reduce the outfitting costs.

Because of the large number of data transmitted to the screen by cable bundle 12 (video, touch interface management data, . . . ), the radius of curvature of cable bundle 12 is relatively significant, and for example ranges between 10 and 15 cm.

Under these conditions, it is difficult to provide a winder for such a cable bundle, in particular in a confined space like an aircraft cockpit.

This invention, by providing means for holding the cable bundle wound at the back of the screen, thus makes it possible to retract and protect the cable bundle and to prevent it from interfering unnecessarily with the environment.

Of course, this invention is not limited to the exemplary embodiments described above.

The invention claimed is:

1. An apparatus comprising:
   a cockpit, the cockpit including:
      an information display device including a screen having a display surface and a rear surface, opposite the display surface, and a cable bundle connected to the screen,
      wherein the rear surface comprises a cable bundle holder holding the cable bundle wound against the rear surface, the information display device being movable between a position in which the cable bundle is held by the cable bundle holder wound against the rear surface of the screen and a position in which the cable bundle is at least partially unwound, and
   wherein the apparatus is an aircraft.

2. The apparatus in accordance with claim 1, wherein the cable bundle holder holds the cable bundle wound at a periphery of the rear surface.

3. The apparatus in accordance with claim 1, wherein a winding direction of the cable bundle against the rear surface is reversible.

4. The apparatus in accordance with claim 1, the rear surface being rectangular, and wherein the cable bundle holder comprises at least elastic fastening elements disposed in corners of the rear surface.

5. The apparatus in accordance with claim 1, further comprising:
   an instrument panel at a front of the cockpit and side walls extending on both sides of the instrument panel,
   wherein the information display device is movable between a main position in which the information display device is fastened to a side wall of the cockpit, the cable bundle being held by the cable bundle holder wound against the rear surface of the screen, and a secondary position in which the information display device is disposed at the instrument panel of the cockpit.

6. The apparatus in accordance with claim 5, wherein in the secondary position of the information display device, the screen is pivoted by 180° in relation to the position of the screen of the information display device in the main position, the cable bundle being at least partially unwound from the rear surface of the screen.

7. The apparatus in accordance with claim 5, wherein in the secondary position, the information display device is installed on a retractable shelf in the cockpit.

8. The apparatus in accordance with claim 5, comprising two identical information display devices occupying two main positions in which the information display devices are fastened respectively to the two opposite side walls of the cockpit, a winding direction of the cable bundle of one of the information display devices being opposite to a winding direction of the cable bundle of the other information display device.

9. The apparatus in accordance with claim 2, wherein the cable bundle holder holds the cable bundle wound around the periphery of the rear surface.

10. The apparatus in accordance with claim 1, wherein the cable bundle holder includes a peripheral rim extending over an entire periphery of the rear surface.

11. The apparatus in accordance with claim 1, wherein the cable bundle holder includes a semi-circular rib disposed in a corner of the rear surface.

12. The apparatus in accordance with claim 1, wherein the cable bundle holder includes a semi-annular accommodation defined by a peripheral rim extending a periphery of the rear surface and a semi-circular rib disposed in a corner of the rear surface.

13. The apparatus in accordance with claim 1, wherein the cable bundle holder includes a continuous channel disposed at a periphery of the rear surface.

14. The apparatus in accordance with claim 1, wherein in the position in which the cable bundle is held by the cable bundle holder wound against the rear surface of the screen, a majority of the cable bundle is retracted behind the display surface.

\* \* \* \* \*